(12) United States Patent
Yu

(10) Patent No.: US 7,903,408 B1
(45) Date of Patent: Mar. 8, 2011

(54) HEAT DISSIPATION DEVICE OF ELECTRONIC CIRCUIT MODULES

(75) Inventor: Hong-Chi Yu, Kaohsiung (TW)

(73) Assignee: Walton Advanced Engineering Inc., Kaohsiung (TW)

( * ) Notice: Subject to any disclaimer, the term of this patent is extended or adjusted under 35 U.S.C. 154(b) by 0 days.

(21) Appl. No.: 12/591,338

(22) Filed: Nov. 17, 2009

(30) Foreign Application Priority Data

Oct. 23, 2009 (TW) ................................ 98135901 A

(51) Int. Cl.
*H05K 7/20* (2006.01)

(52) U.S. Cl. ......... 361/695; 361/690; 361/694; 361/719; 257/712; 257/721; 174/16.1

(58) Field of Classification Search .................. None
See application file for complete search history.

(56) References Cited

U.S. PATENT DOCUMENTS

| | | | |
|---|---|---|---|
| 7,297,024 B2 * | 11/2007 | Ni et al. | 439/607.23 |
| 7,507,119 B2 * | 3/2009 | Ni et al. | 439/607.31 |
| 7,524,198 B2 * | 4/2009 | Nguyen et al. | 439/131 |
| 7,535,719 B2 * | 5/2009 | Hiew et al. | 361/737 |
| 7,686,656 B2 * | 3/2010 | Zheng et al. | 439/660 |
| 7,751,204 B2 * | 7/2010 | Wilber et al. | 361/818 |
| 7,766,672 B1 * | 8/2010 | Chiang | 439/76.1 |
| 2007/0056016 A1 * | 3/2007 | Shih | 725/134 |
| 2008/0059680 A1 * | 3/2008 | Hiew et al. | 710/301 |
| 2008/0212297 A1 * | 9/2008 | Ni et al. | 361/760 |
| 2009/0190277 A1 * | 7/2009 | Hiew et al. | 361/56 |
| 2010/0091469 A1 * | 4/2010 | Lin | 361/752 |
| 2010/0177487 A1 * | 7/2010 | Arshad et al. | 361/737 |

* cited by examiner

*Primary Examiner* — Boris L Chervinsky
(74) *Attorney, Agent, or Firm* — Bacon & Thomas, PLLC

(57) ABSTRACT

A heat dissipation device of electronic circuit modules has a substrate, a heat dissipation element and a housing. The housing is hollow and has an airflow passage therein. Heat generated when electronic components of the substrate is operated is conducted to the heat dissipation element and is guided out of the device by heat convection generated inside the housing by the design of the airflow passage.

50 Claims, 8 Drawing Sheets

HEAT DISSIPATION DEVICE OF ELECTRONIC CIRCUIT MODULES

FIELD OF THE INVENTION

The present invention is related to a heat dissipation device of electronic circuit device, and more particularly to a heat dissipation device of electronic circuit device by means of heat conduction and heat convection.

BACKGROUND OF THE INVENTION

Currently, electronic circuit modules by and large employ heat dissipation device, such as, fan, heat sink, air cooling system or the like, to dissipate heat generated therefrom. For compact electronic equipment, especially portable data storage devices, these heat dissipation solutions appear to be costly due to bulky size thereof. Nowadays, as the memory capacity or additional functions of portable data storage devices are all significantly upgraded, the heat dissipation problem arising from all components thereof in operation becomes inevitable. However, with reference to FIG. 1 in association with Taiwanese Patent Publication No. M314875, a heat dissipation device of a conventional portable data storage device is similar to that for a flash drive, in which a circuit board (1) is mounted between an upper case (2) and a lower case (3), and heat is dissipated through heat dissipation holes (4) formed on the lower case (3). However, such heat dissipation structure does not address an acceptable heat dissipation effect. Therefore, it is imperative for compact electronic equipment to tackle the heat dissipation problem. Besides, users are unable to gain extra fun and unusual experience when using the product.

SUMMARY OF THE INVENTION

In view of the foregoing problem, a main objective of the present invention is to provide a heat dissipation device of electronic circuit modules including a housing, an electronic circuit module and a heat dissipation element. The housing is hollow and has an airflow passage formed therein. Heat generated when the electronic circuit module is operated is conducted to the heat dissipation element and is guided out of the device by heat convection generated inside the housing by the airflow passage, so that the electronic circuit module can have better heat dissipation.

Another objective of the present invention is to provide a heat dissipation device of electronic circuit modules, which include a housing, an electronic circuit module and a heat dissipation element. The housing is hollow and has an airflow passage therein. Heat generated when the electronic circuit module is operated is conducted to the heat dissipation element. An aromatic ingredient is mounted to abut the heat dissipation element. The smell of the aromatic ingredient radiates out when heat is further guided out of the device by heat convection generated inside the housing, thereby enjoying unusual and interesting operational experience when users operate the product and enhancing add-on value of the product.

To achieve the foregoing object, the main technical means of the present invention is realized by a first technical solution: A heat dissipation device of electronic circuit modules has a substrate, a heat dissipation element and a housing.

The substrate has at least one electronic component, an inner surface and an outer surface. The outer surface has at least one external contact pad mounted on one end thereof, and at least one transfer contact pad mounted on the other end thereof and electrically connected with the at least one external contact pad.

The heat dissipation element has a plurality of heat conductors contacted with the at least one transfer contact pad and takes an uneven form, and is mounted on a surface of the substrate having the at least one transfer contact pads.

The housing is hollow, and has two openings formed on two sides thereof, a front cover and a rear cover respectively mounted to the two openings, and an airflow passage formed therein.

The substrate is mounted inside the housing, the at least one external contact pad penetrates through the front cover and is exposed beyond the housing, heat generated when the at least one electronic component is operated is conducted to the plurality of heat conductors through the at least one transfer contact pad and is guided out of the at least one electronic component by heat convection generated inside the housing by the airflow passage.

The present invention can adopt a second technical solution: A heat dissipation device of electronic circuit modules has at least one substrate, at least one heat dissipation element and at lest one housing.

The at least one substrate has at least one electronic component, an inner surface, and an outer surface.

The outer surface has at least one external contact pad mounted on one end thereof and at least one transfer contact pad mounted on the other end thereof, and is electrically connected with the external contact pad.

The at least one heat dissipation element has a plurality of heat conductors contacted with the at least one transfer contact pad and the at least one external contact pad of another substrate, takes an uneven form, and is mounted on a surface of another substrate having the at least one transfer contact pads.

The at least one housing is hollow, and has two openings formed on two sides thereof, a front cover and rear cover respectively mounted to the two openings, and an airflow passage formed therein.

The at least one substrate is mounted inside the housing, the at least one external contact pad penetrates through the front cover and is exposed beyond the housing, the rear cover has a through slot, the at least one external contact pad of the at least one substrate inside the housing penetrates through the through slot of the rear cover of another housing to be electrically connected with the at least one external contact pad of the another substrate through the plurality of heat conductors of the heat dissipation element thereof, heat generated when the electronic components of those substrates are operated is conducted to the plurality of heat conductors of the substrates through the external contact pads or the transfer contact pads of the substrates and is guided out of the at least one electronic component by heat convection generated inside the housings by the airflow passages.

The present invention can adopt a third technical solution: A heat dissipation device of electronic circuit modules has at least one substrate, at least one heat dissipation element, at least one housing, an end substrate, an end heat dissipation element and an end housing.

The at least one substrate has at least one electronic component, an inner surface and an outer surface.

The outer surface has at least one external contact pad mounted on one end thereof and at least one transfer contact pad mounted on the other end thereof, and is electrically connected with the external contact pad.

The at least one heat dissipation element has a plurality of heat conductors contacted with the at least one transfer contact pad and the at least one external contact pad of another substrate, and takes an uneven form, and is mounted on a surface of the at least one substrate having the at least one transfer contact pad.

The at least one housing is hollow, and has two openings formed on two sides thereof, a front cover and rear cover respectively mounted to the two openings, and an airflow passage formed therein.

The end substrate has at least one electronic component, an inner surface, and an outer surface having at least one external contact pad mounted on one end thereof.

The end heat dissipation device is electrically connected with the end substrate.

The end housing is hollow, and has two openings formed on two sides thereof, a front cover and a rear cover respectively mounted to the two openings thereof, and an airflow passage formed therein.

The at least one substrate is respectively mounted inside the at least one housing, the at least one external contact pad of the at least one substrate penetrates through the corresponding front cover and is exposed beyond the corresponding housing, the rear cover has a through slot, the end heat dissipation device and the end substrate are mounted inside the end housing, the at least one external contact pad of the end substrate penetrates through the front cover of the end substrate and is exposed beyond the end housing, heat generated when the electronic components are operated is conducted to the plurality of heat conductors through the external contact pads or the transfer contact pads and is guided out of the electronic components by heat convection formed by wind pressure generated by the airflow passages when the end heat dissipation device is operated.

The objectives and the solutions to technical problems of the present invention can be further realized by the following approaches.

Preferably, the at least one external contact pad of one substrate is electrically connected with and reversely and crossly stacked on the at least one transfer contact pad of another substrate through the plurality of heat conductors of the heat dissipation element of the at least one substrate.

Preferably, the at least one external contact pad of one substrate is coplanarly and electrically connected with the at least one transfer contact pad of another substrate through the plurality of heat conductors of the heat dissipation element of the at least one substrate.

Preferably, the at least one external contact pad of the end substrate is electrically connected with and reversely and crossly stacked on the at least one transfer contact pad of another substrate through the plurality of heat conductors of the heat dissipation element of the at least one substrate.

Preferably, the at least one external contact pad of the end substrate is coplanarly and electrically connected with the at least one transfer contact pad of another substrate through the plurality of heat conductors of the heat dissipation element of the at least one substrate.

Preferably, the at least one electronic component of the substrate comprises at least one IC chip, at least one passive component, and at least one controller, and the IC chip is mounted on the inner surface of the substrate.

Preferably, the passive component and the controller are mounted on the outer surface of the substrate.

Preferably, the at least one electronic component of the end substrate comprises at least one IC chip, at least one passive component, and at least one controller, and the at least one IC chip is mounted on the inner surface of the end substrate.

Preferably, the at least one passive component and the at least one controller are mounted on the outer surface of the end substrate.

Preferably, the airflow passage of the housing takes a form wide outside and narrow inside, and a narrow neck of the airflow passage forms an airflow acceleration zone.

Preferably, a package is formed on the inner surface of the substrate and has an outer periphery, a heat-conducting layer is mounted on the outer periphery and is made arbitrarily at least one material of copper, aluminum and silver.

Preferably, the plurality of heat conductors are made arbitrarily at least one material of copper, aluminum and silver.

Preferably, the housings are tightly connected each other so as to guide the heat generated out of the housings.

Preferably, the front cover has at least one first air vent, and the rear cover has at least one second air vent.

Preferably, the front cover of the end housing has at least one first air vent, and the rear cover has at least one second air vent.

Preferably, a first venting sheet is mounted between the front cover and the opening of the housing, and a second venting sheet is optionally mounted between the front cover and the opening of the rear cover of the housing.

Preferably, a first venting sheet is mounted between the front cover and the opening of the end housing, and a second venting sheet is optionally mounted between the front cover and the opening of the rear cover of the end housing.

Preferably, a pressing element is mounted inside the housing so as to move up and down inside the housing, the pressing element surrounds the substrate and has a thrust piece, a pressing part and an elastomer, the pressing part and the elastomer are oppositely mounted on two sides of the thrust piece, and the pressing part is partially exposed beyond the housing.

Preferably, the elastomer is one of compression spring, rubber and metal spring leaf.

Preferably, the elastomer and the thrust piece are integrally formed.

Preferably, the housing is snapped onto a cap to receive the external contact pad inside the cap.

Preferably, the heat dissipation element is a cooling fan.

Preferably, the heat element is electrically connected with the end substrate through one of bus, wire and metal bump.

Preferably, the at least one external contact pad of the substrate is compatible with any one of USB, Mini USB, Micro USB and e-SATA transmission interface.

The efficacy of the present invention is to conduct heat generated when the at least one IC chip is operated is conducted to the plurality of heat conductors through the at least one external contact pad or the at least one transfer contact pad, and is guided out of the device by the airflow passage inside the housing. Preferably, an end housing is further mounted, and a heat dissipation element is mounted inside the end housing. Heat is rapidly guided out of the device by heat convection formed by wind pressure generated when the heat dissipation element is operated so that these electronic circuit modules have better heat dissipation effect. Moreover, the aromatic ingredient can be mounted to abut the heat conductors. When heat convection is generated inside the housing, the fragrant smell of the aromatic ingredient is radiated out, thereby increasing add-on value of the product.

The foregoing and other features and advantages of the present invention will be more clearly understood through the following descriptions with reference to the drawing, wherein:

BRIEF DESCRIPTION OF THE DRAWINGS

FIG. 3a is an exploded view in FIG. 2a;

DETAILED DESCRIPTION OF THE PREFERRED EMBODIMENT

It is to be noted that the following descriptions of preferred embodiments of this invention are presented herein for purpose of illustration and description only; it is not intended to be exhaustive or to be limited to the precise form disclosed.

Figure 1:
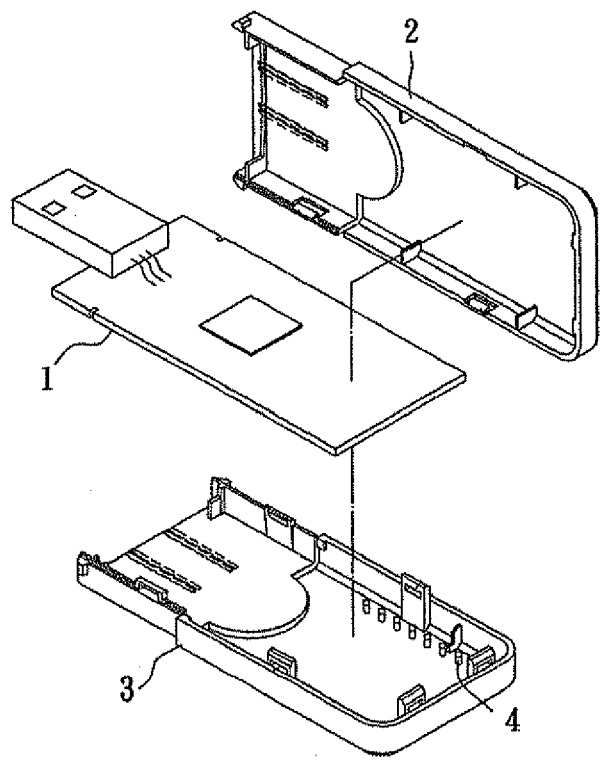
FIG. 1 is an exploded view of a conventional flash drive.
Figure 2A:
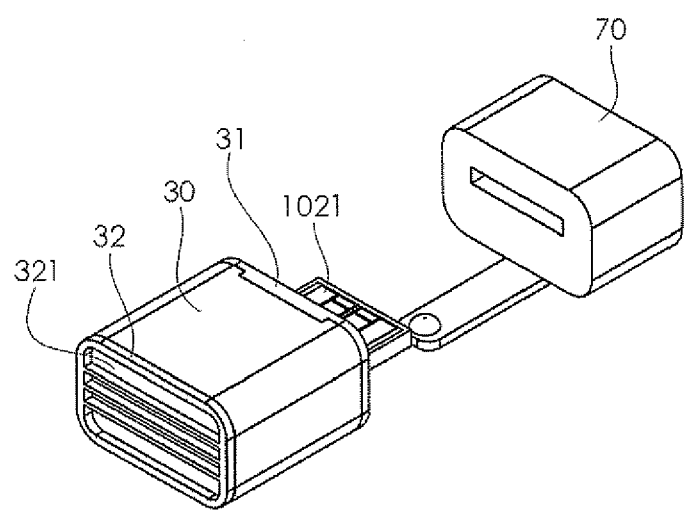
FIG. 2a is a perspective view of a first preferred embodiment of a heat dissipation device of electronic circuit modules in accordance with the present invention.
Figure 3A:
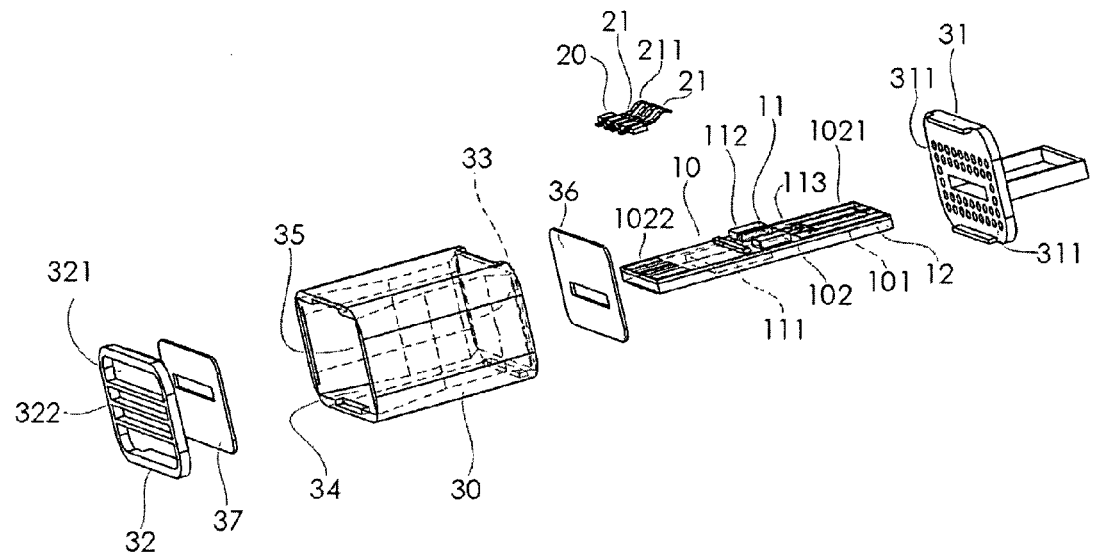
Figure 5A:
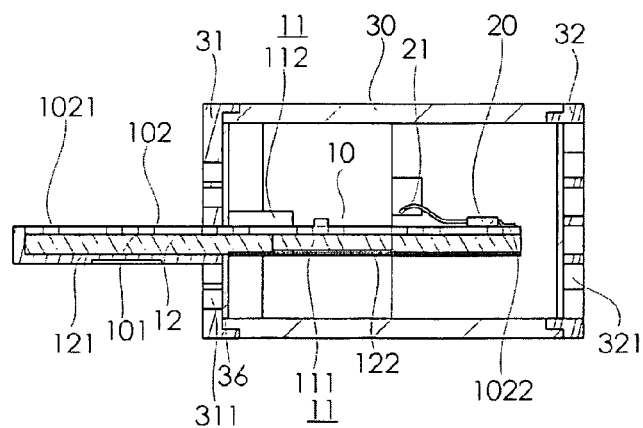
FIG. 5a is a cross-sectional view of the first embodiment of the heat dissipation device of electronic circuit modules in accordance with the present invention.

With reference to FIGS. 2a, 3a and 5a, a first embodiment of a heat dissipation device of electronic circuit modules in accordance with the present invention has a substrate (10), a heat dissipation element (20), and a housing (30). The substrate (10) has at least an electronic component (11), an inner surface (101) and an outer surface (102). The substrate (10) may be a high-density and two-sided conductive multi-layer printed circuit board and has a circuit formed therein (not shown). At least one external contact pad is mounted on one end of the outer surface (102), and at least one transfer contact pad (1022) is mounted on the other end. The external contact pad (1021) is electrically connected with the at least one transfer contact pad (1022) through a circuit (not shown) of the substrate (10). The at least one external contact pad (1021) is compatible with any one of Universal Serial Bus (USB) transmission interface, Mini USB transmission interface, Micro USB transmission interface and e-SATA transmission interface.

Besides, the at least one electronic component (11) of the substrate (10) respectively has at least one IC chip (111), at least a passive component and at least one controller (113). The at least one IC chip (111) is mounted on an inner surface (101) of the substrate (10), and the at least one passive component (112) and the at least one controller (113) may be mounted on the outer surface (101) or the inner surface (102) of the substrate (10). In the first embodiment, the at least one passive component (112) and the at least one controller (113) are mounted on the outer surface (102) of the substrate (10). The at least one IC chip (111) is electrically connected with the substrate (10) by wire bond formed by wire bonding or flip chip bonding technique. Usually, the IC chip (111) may be a flash memory, a Static Random Access Memory (SRAM), an Application-specific Integrated Circuit (ASIC), or a Synchronous Dynamic Random Access Memory (SDRAM). Preferably, a package (12) is formed on the inner surface (101) of the substrate (10) and has an outer periphery (121).

A heat-conducting layer (122) is mounted on the outer periphery (121) and is made arbitrarily at least one material of copper, aluminum and silver. Moreover, the heat dissipation element (20) has a plurality of heat conductors (21) and is mounted on a surface of the substrate (10) having the plurality of transfer contact pads (1022). The plurality of heat conductors (21) are respectively connected with the plurality of transfer contact pads (1022). These plurality of heat conductors (21) have an uneven structure (211) and are made arbitrarily at least one material of copper, aluminum and silver. Preferably, the heat conductor (21) may include but is not limited to one of bump, spring leaf and fin, or a combination thereof. Any other heat dissipation forms can do. Preferably, an aromatic ingredient (not shown) is mounted to abut these heat conductors (21).

Figure 4A:
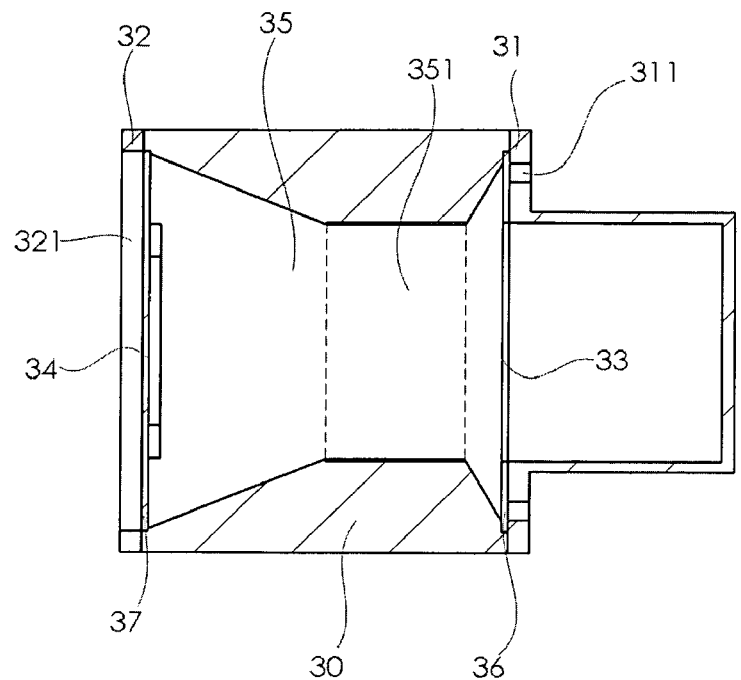
FIG. 4a is a cross-sectional view of a flow channel of the first preferred embodiment of the heat dissipation device of electronic circuit modules in accordance with the present invention.

The housing (30) has a front cover (31) and a rear cover (32), takes a hollow form, and has two openings (33, 34) respectively formed at two ends thereof. The front cover (31) and the rear cover (32) are respectively mounted to the two openings (33, 34). Preferably, the front cover (31) has at least one first air vent (311), and the rear cover (32) has at least one second air vent (321). An airflow passage (35) is formed inside the housing (30). With reference to FIG. 4a, the airflow passage (35) takes a form wide outside and narrow inside. Hence, the narrow neck of the airflow passage (35) forms an airflow acceleration zone (351). When airflow flows through the airflow acceleration zone (351), the airflow carrying heat is accelerated and heat is rapidly guided out as a result of the pressure difference of the airflow passage (35) caused by the wide-outside-and-narrow-inside spatial variation thereof. Furthermore, the form of the airflow passage which is wide outside and narrow inside is not limited to the illustration of FIG. 4a. Other spatial forms, such as arced and irregular shape, and the like, may be also included.

With reference to FIGS. 2a, 3a and 5a, the substrate (10) is mounted inside the housing (30), and the at least one external contact pad (1021) of the substrate (10) penetrates through the front cover (31) and is exposed beyond the housing (30). Preferably, a venting sheet (37) is mounted between the rear cover (32) and the opening (34) of the housing (30) to prevent micro-particles, e.g. powder, dust and so on, from entering the housing (30) and impeding operation of the present invention. In addition, the housing (30) is snapped onto a cap (70) so that the at least one external contact pad (1021) is received in the cap (70) to alleviate damage of the at least one external contact pad (1021) resulting from collision or other reasons.

Preferably, the heat dissipation device of electronic circuit modules may be a heat dissipation device of a portable data storage equipment, such as flash drive, portable hard drive or the like, and it is the heat dissipation device of a flash drive in the first embodiment. Given the aforementioned device, heat generated when the at least one electronic components (11) of the substrate (10) is operated, is conducted to the plurality of heat conductors (21) or to a heat-conducting layer (122) through the at least one transfer contact pad (1022). At the time, because of the airflow passage structure, heat is guided out of the device by heat convection generated inside the housing (30). The smell of the aromatic ingredient (not shown) radiates out when heat is generated inside the housing, thereby increasing add-on value of the product.

Figure 2B:
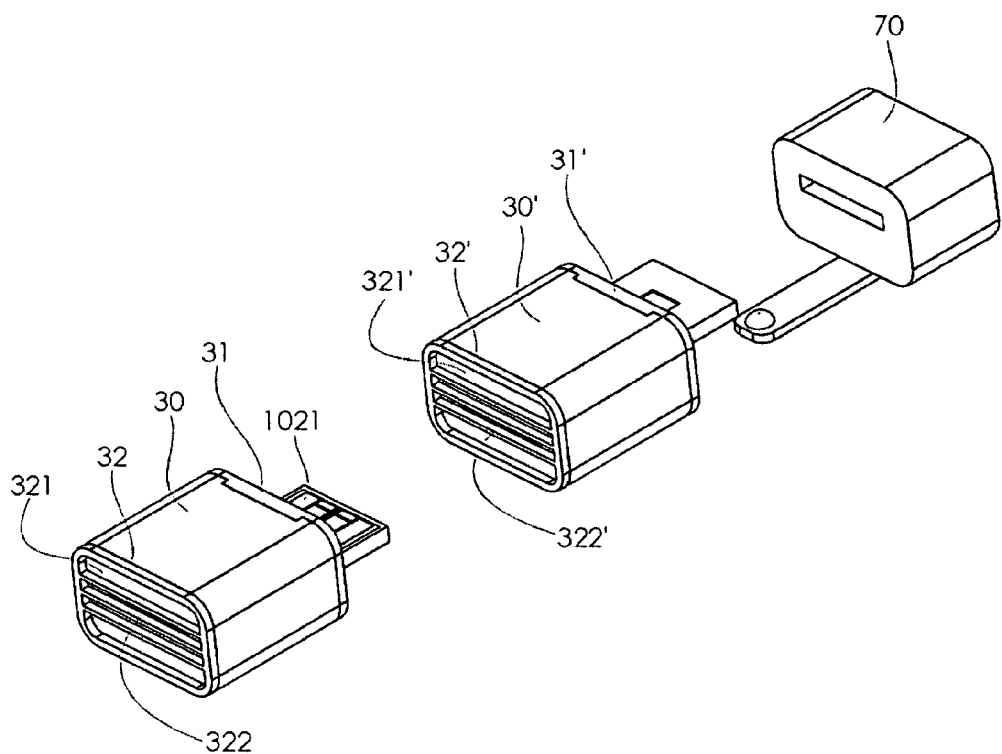
FIG. 2b is a perspective view of a second preferred embodiment of a heat dissipation device of electronic circuit modules in accordance with the present invention.
Figure 4B:
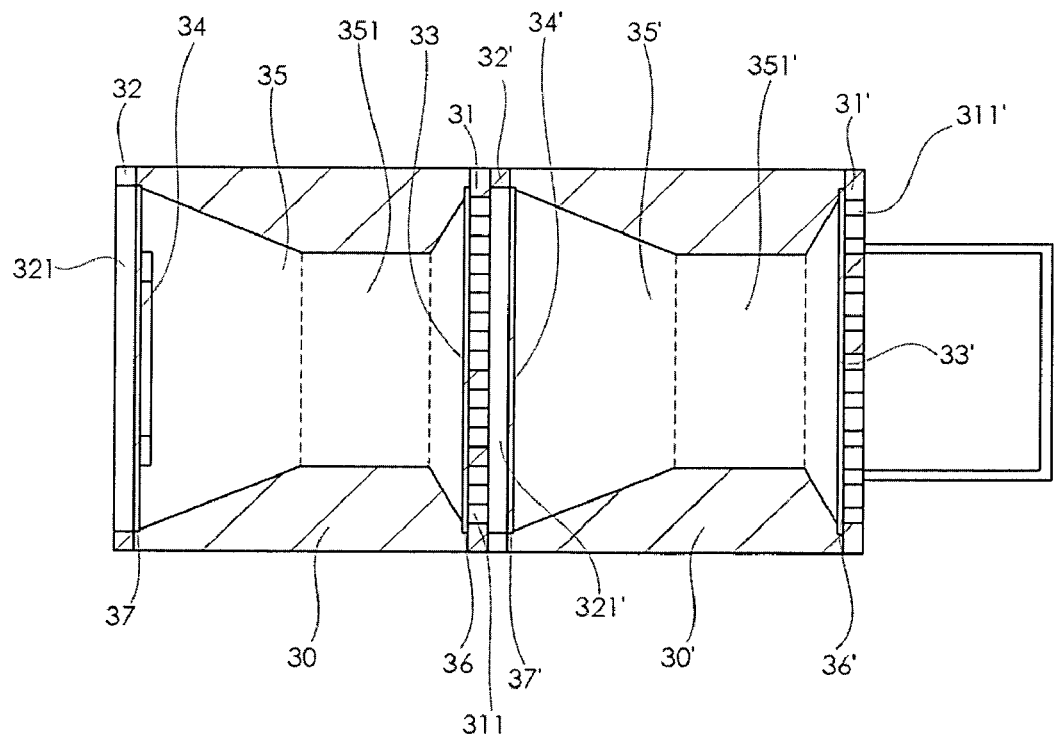
FIG. 4b is a cross-sectional view of a flow channel of the second preferred embodiment of the heat dissipation device of electronic circuit modules in accordance with the present invention.
Figure 4C:
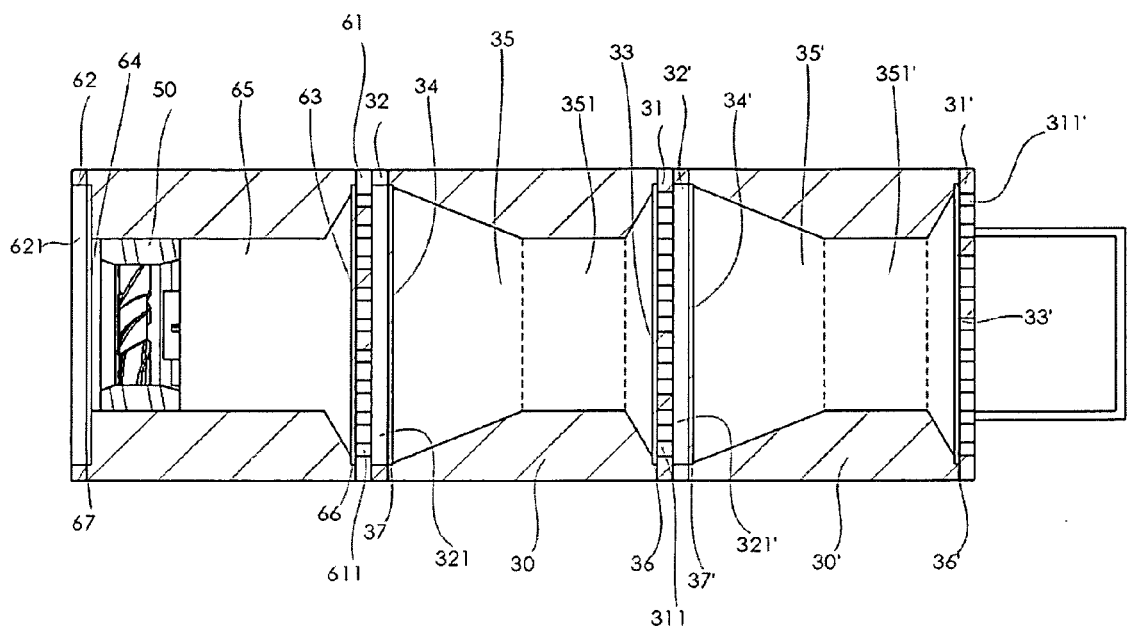
FIG. 4c is a cross-sectional view of a flow channel of the third preferred embodiment of the heat dissipation device of electronic circuit modules in accordance with the present invention.
Figure 5B:
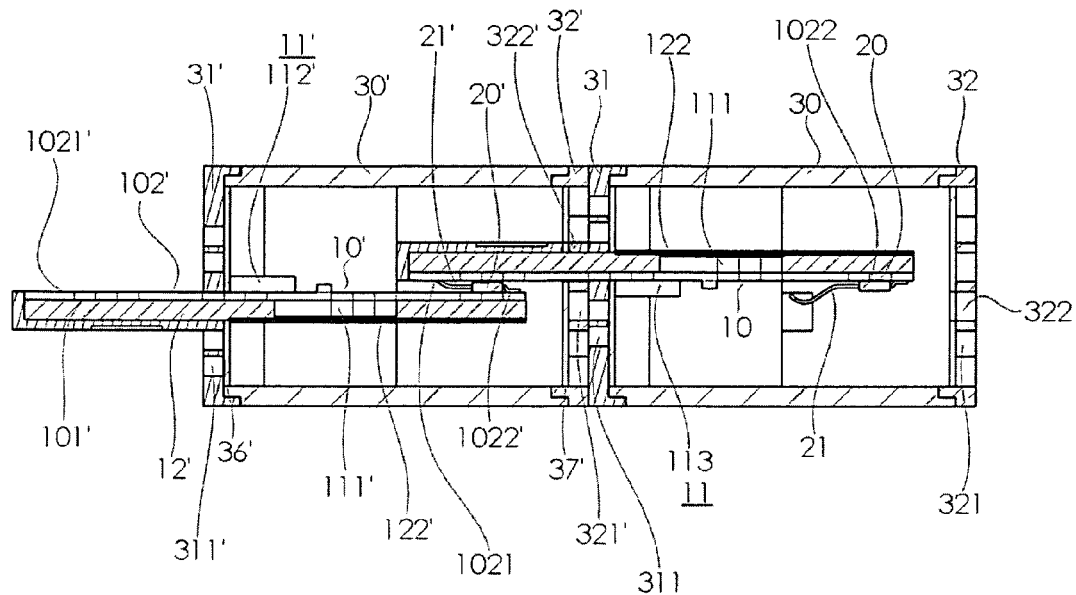
FIG. 5b is a cross-sectional view of the second embodiment of the heat dissipation device of electronic circuit modules in accordance with the present invention.
Figure 5C:
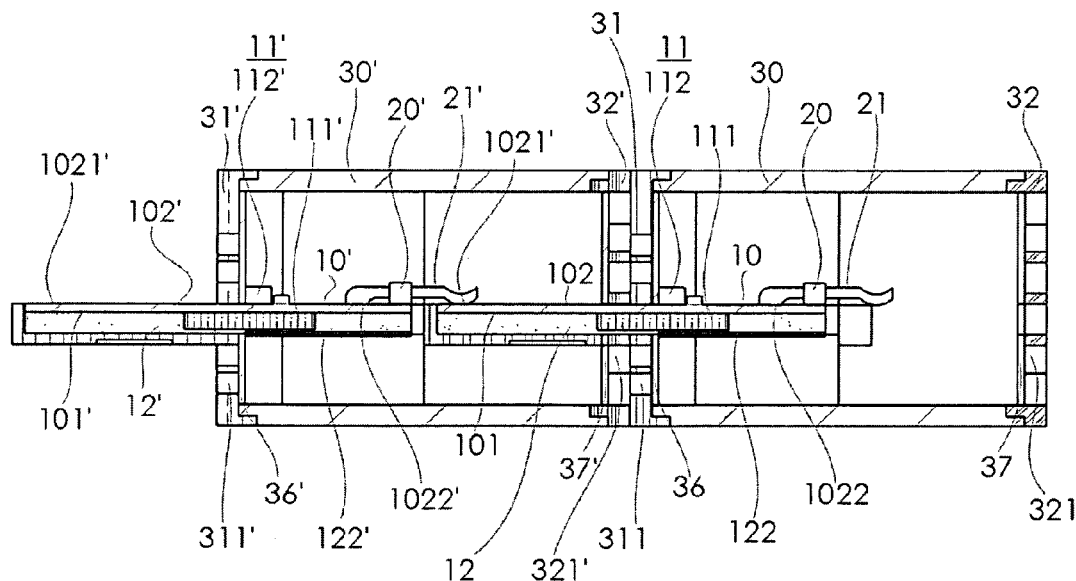
FIG. 5c is another cross-sectional view of the second embodiment of the heat dissipation device of electronic circuit modules in accordance with the present invention.

With reference to FIGS. 2b and 5b, a second embodiment of a heat dissipation device of electronic circuit modules in accordance with the present invention is illustrated, and parts in the second embodiment similar to those in FIGS. 2a, 3a and 5a which are marked with same reference numerals are not repeated hereafter. The second embodiment mainly differs from the first embodiment in that the there are at least one substrate (10), at least one heat dissipation element (20), and at least one housing (30). This allows the present invention to have memory capacity expansion capability and other additional multifunctional modules. Besides, a through slot (322) is formed through a rear cover (32) of the housing (30). By means of the above-mentioned assembly parts, at least one external contact pad (1021) of a substrate (10) can penetrate through a through slot (322') of a rear cover (32') of another housing (30') to be electrically connected with at least one transfer contact pad of another substrate (10') through a plurality of heat conductors (21') of a heat dissipation element (20'). The housings (30, 30') are tightly connected each other. The at least one external contact pad (1021) of the substrate (10) is electrically connected with and is reversely and crossly stacked on the at least one transfer contact pad (1022') of another substrate (10') by the plurality of heat conductors (21') of the heat dissipation element (20'), or is electrically connected therewith coplanarly as shown in FIG. 5c. Consequently, heat generated when electronic components (11, 11') of these substrates (10, 10') are operated are conducted to the heat conductors (21, 21') or heat-conducting layers (122, 122') through the external contact pads (1021, 1021') and the transfer contact pads (1022, 1022'). Given the design of airflow acceleration zones (351, 351') of airflow passages (35, 35') as shown in FIG. 4b, heat generated inside the housings (30, 30') is guided out of the assembly components by heat convection so as to dissipate heat generated by the assembly components and increase add-on value of the product.

Figure 2C:
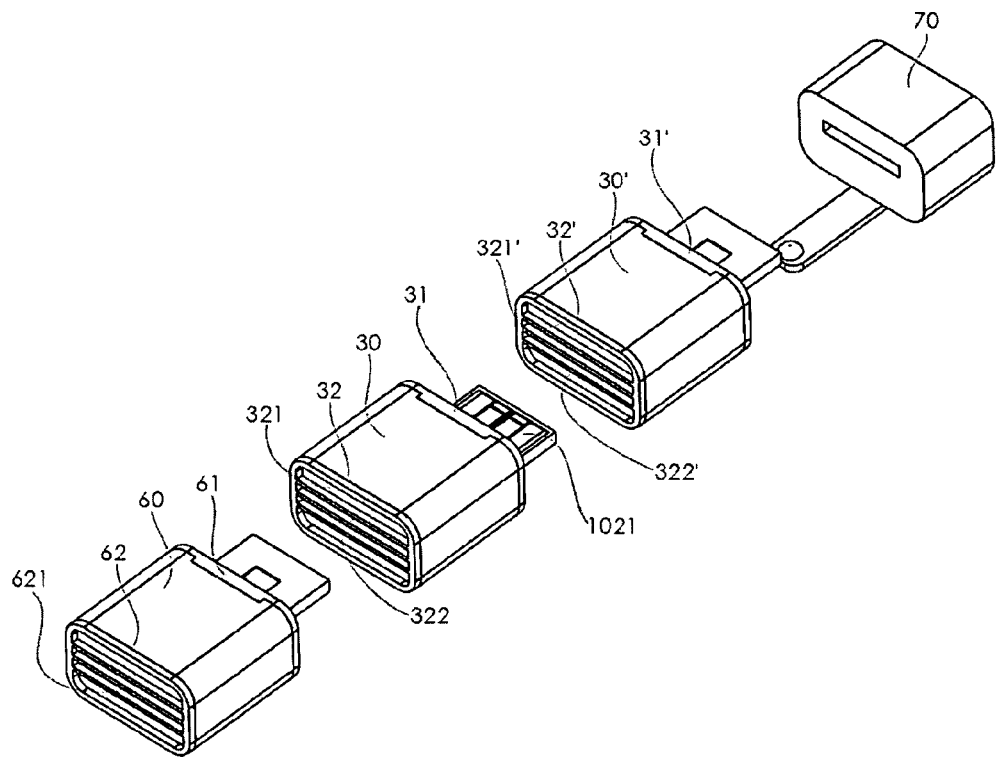
FIG. 2c is a perspective view of a third preferred embodiment of a heat dissipation device of electronic circuit modules in accordance with the present invention.
Figure 3B:
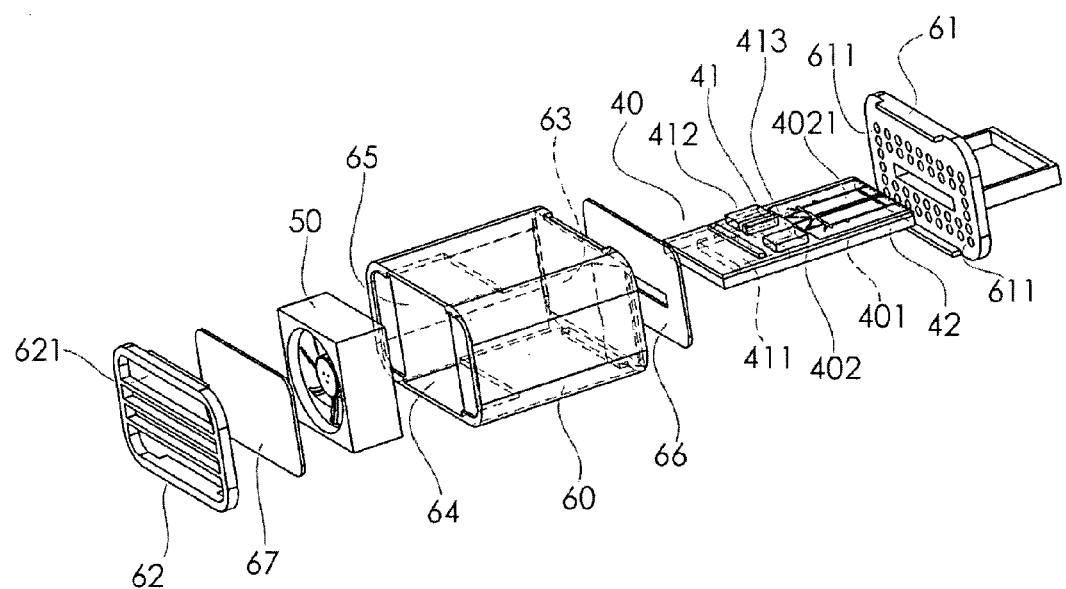
FIG. 3b is an exploded view in FIG. 2c.
Figure 6A:
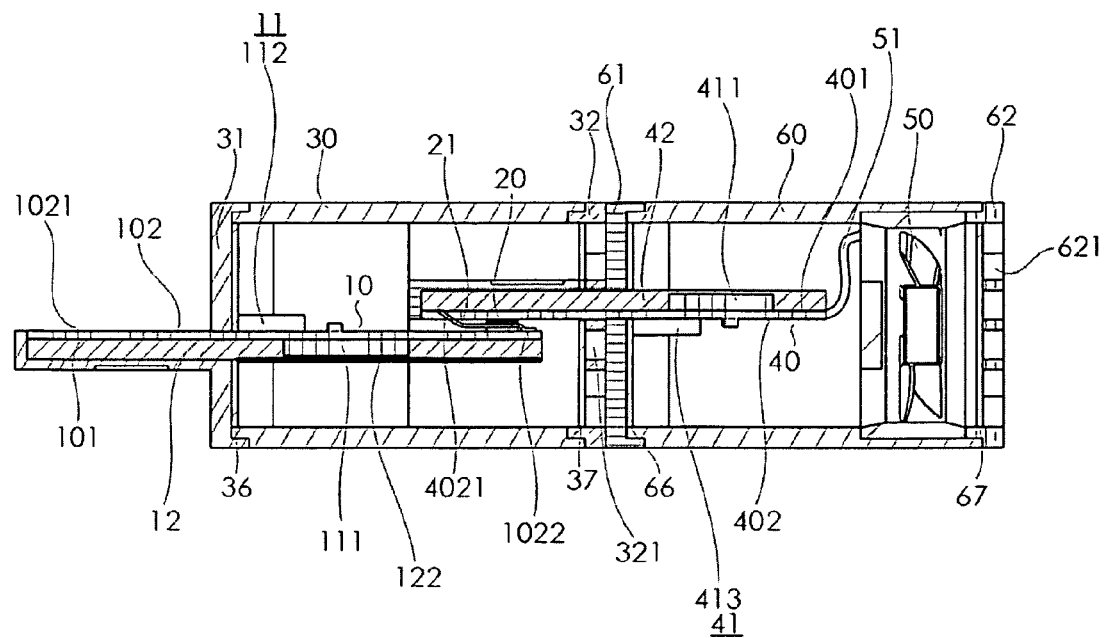
FIG. 6a is a cross-sectional view of the third embodiment of the heat dissipation device of electronic circuit modules in accordance with the present invention.
Figure 6B:
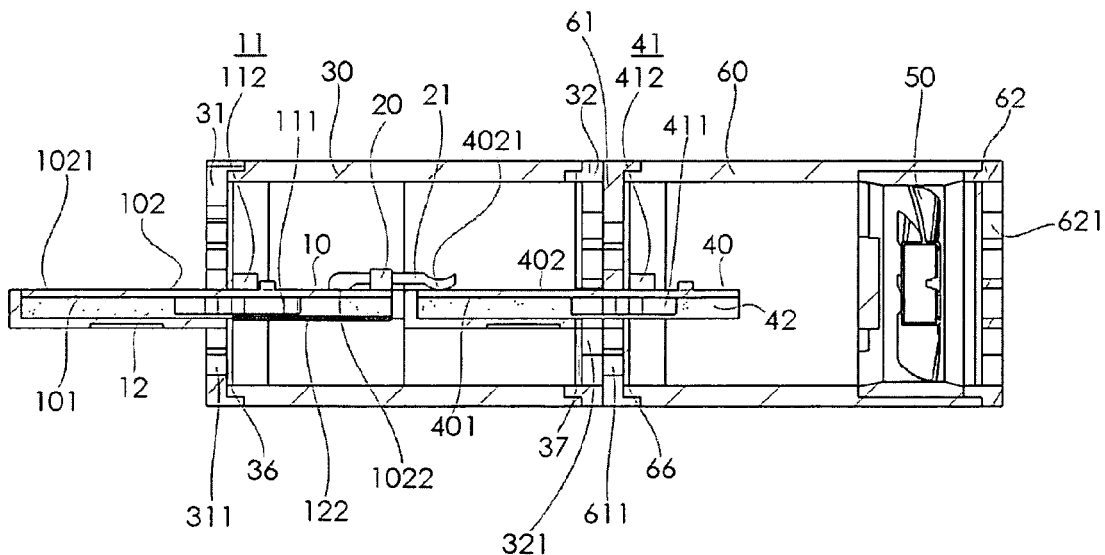
FIG. 6b is another cross-sectional view of the third embodiment of the heat dissipation device of electronic circuit modules in accordance with the present invention.

With reference to FIGS. 2c and 3b, a third embodiment of a heat dissipation device of electronic circuit modules in accordance with the present invention is illustrated, and parts in the second embodiment similar to those in FIGS. 2a, 3a and 5a associated with the first embodiment and those in FIGS. 2b and 5b associated with the second embodiment which are marked with same reference numerals are not repeated hereafter. The third embodiment differs from the first embodiment and the second embodiment in that an end substrate (40), an end heat dissipation device (50) and an end housing (60) are additionally mounted. The end substrate (40) has at least one electronic component (41), an inner surface (401) and an outer surface (402). With reference to FIG. 6a, at least one external contact pad (4021) is mounted on the outer surface (402). The at least one external contact pad (4021) of the end substrate (40) is electrically connected with and is reversely and crossly stacked on the at least one transfer contact pad (1022) of another substrate (10) by the plurality of heat conductors (21) of the heat dissipation element (20), or is electrically connected therewith coplanarly as shown in FIG. 6b. This allows the present invention to have memory capacity expansion capability and other additional multifunctional modules. Preferably, the at least one electronic components of the end substrate (40) has at least one IC chip (411), at least one passive component (412) and at least one controller (413) as shown in FIG. 3b. The IC chip (411) is mounted on the inner surface (401) of the end substrate (40). The passive component (412) and the controller (413) may be mounted on the outer surface (402) or the inner surface (401) of the end substrate (40). In the third embodiment, the at least one passive component (412) and the at least one controller (413) are mounted on the inner surface (401) of the end substrate. Besides, the heat dissipation device (50) is electrically connected with the end substrate (40) through one of a bus (not shown), a wire (51), a metal bump (not shown) and a spring leaf (not shown). Preferably, the heat dissipation device may be cooling fan.

With further reference to FIGS. 3b and 6a, the end housing has a front cover (61) and a rear cover (62), takes a hollow form, and has two openings (63, 64) respectively formed at two ends thereof. The front cover (31) and the rear cover (32) are respectively mounted to the two openings (33, 34). Preferably, the front cover (61) of the end housing (60) has at least one first air vent (611), the rear cover (62) of the end housing (60) has at least one second air vent (621), and a first venting sheet (66) is mounted between the front cover (61) of the end housing (60) and the opening (63) of the end housing (30) and a second venting sheet (67) is mounted between the rear cover (60) of the end housing and the opening (64) of the end housing (60) to prevent micro-particles, e.g. powder, dust and so on, from entering the end housing (60) and impeding operation of the present invention. With reference to FIGS. 2c, 3b, 4c and 6a, an airflow passage (65) is formed inside the end housing (60). The heat dissipation device (50) and the end substrate (40) are mounted inside the end housing (60), and at least one external contact pad (4021) penetrates through the front cover (61) and is exposed beyond the end housing (60). Therefore, when the aforementioned components are operated, the resulting heat is conducted to the heat conductors (21) by the substrate (10) or the end substrate (40) through the external contact pads (1021, 4021) or the transfer contact pad (1022), and is rapidly guided out of the components by heat convection caused by wind pressure when the heat dissipation device (50) is operated, so as to dissipate heat generated by the components and increase add-on value of the product.

Figure 7A:
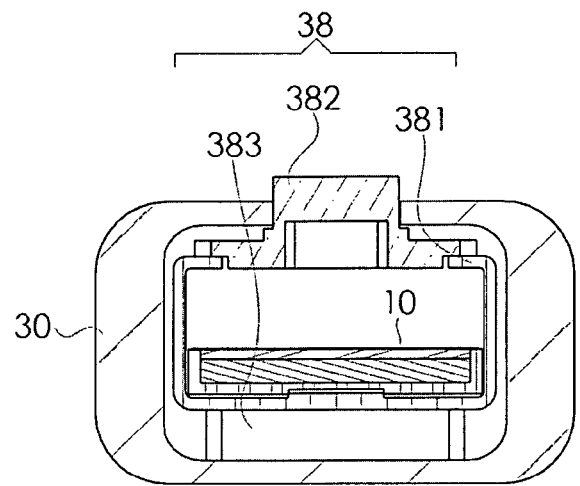
FIG. 7a is a cross-sectional view of a fourth embodiment of a heat dissipation device of electronic circuit modules in accordance with the present invention.
Figure 7B:
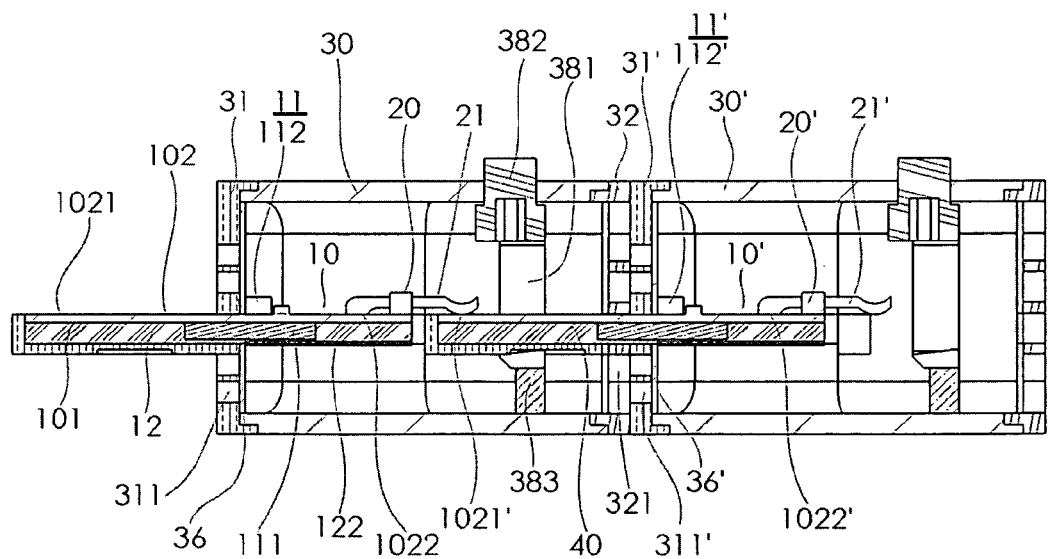
FIG. 7b is another cross-sectional view of the fourth embodiment of the heat dissipation device of electronic circuit modules in accordance with the present invention.

With reference to FIGS. 7a and 7b, a fourth embodiment of a heat dissipation device of electronic circuit modules is illustrated, and parts in the fourth embodiment similar to those in FIGS. 2b and 5b associated with the second embodiment and those in FIGS. 2c and 3b associated with the third embodiment which are marked with same reference numerals are not repeated hereafter. The fourth embodiment differs from the second embodiment and the third embodiment in that a pressing element (38) is mounted inside the housing (30) so as to move up and down inside the housing (30). The pressing element (38) may surround the substrate (10). Besides, the pressing element (38) has a thrust piece (381), a pressing part (382) and an elastomer (383). The pressing part (382) and the elastomer (382) are oppositely mounted on two sides of the thrust piece (381). The pressing part (382) is partially exposed beyond the housing (30). With further reference to FIGS. 7a and 7b, when the plurality of housings (30, 30') are mounted as a whole, a transfer contact pad (1022) of the substrate (10) is tightly contacted with an external contact pad (1021') of another substrate (10') through a heat conductor (21) by the elastic force of the elastomer (383). The elastomer (383) may be one of compression spring, rubber and metal spring leaf. Preferable, the elastomer (383) and the thrust piece (381) are integrally formed. The pressing element in the fourth embodiment may be additionally mounted in the second embodiment and the third embodiment to provide better fixing effect among a plurality of housings.

In sum, heat generated when the IC chip is operated is conducted to the heat-conducting layer and to the heat conductors through the external contact pad and the transfer contact pad, and is guided out of the device by an airflow passage design inside the housing. Alternatively, an end housing is further mounted and a heat dissipation device is mounted inside the end housing so that heat is rapidly guided out the components when the heat dissipation device is operated to generate wind pressure in formation of heat convection. The electronic circuit modules are equipped with better heat dissipation effect, thereby providing better heat dissipation effect to the electronic circuit modules. Moreover, aromatic ingredient is mounted to abut the heat conductor so as to radiate fragrance thereof when heat convection is generated inside the housing to increase add-on value of the product. The present invention thus provides the practical and innovative value to the industry, and the application is hereby submitted in accordance with the patent laws.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A heat dissipation device of electronic circuit modules, comprising:
    a substrate having
        at least one electronic component;
        an inner surface; and
        an outer surface having at least one external contact pad mounted on one end thereof, and at least one transfer contact pad mounted on the other end thereof and electrically connected with the at least one external contact pad; and
    a heat dissipation element having a plurality of heat conductors contacted with the at least one transfer contact pad and taking an uneven form, and mounted on a surface of the substrate having the at least one transfer contact pads; and
    a housing being hollow, and having two openings formed on two sides thereof, a front cover and a rear cover respectively mounted to the two openings, and an airflow passage formed therein;
    wherein the substrate is mounted inside the housing, the at least one external contact pad penetrates through the front cover and is exposed beyond the housing, heat generated when the at least one electronic component is operated is conducted to the plurality of heat conductors through the at least one transfer contact pad and is guided out of the at least one electronic component by heat convection generated inside the housing by the airflow passage.

2. The heat dissipation device as claimed in claim 1, wherein the at least one electronic component of the substrate comprises at least one IC chip, at least one passive component, and at least one controller, and the IC chip is mounted on the inner surface of the substrate.

3. The heat dissipation device as claimed in claim 1, wherein the passive component and the controller are mounted on the outer surface of the substrate.

4. The heat dissipation device as claimed in claim 1, wherein the airflow passage of the housing takes a form wide outside and narrow inside, and a narrow neck of the airflow passage forms an airflow acceleration zone.

5. The heat dissipation device as claimed in claim 1, wherein a package is formed on the inner surface of the substrate and has an outer periphery, a heat-conducting layer is mounted on the outer periphery and is made arbitrarily at least one material of copper, aluminum and silver.

6. The heat dissipation device as claimed in claim 1, wherein the plurality of heat conductors are made arbitrarily at least one material of copper, aluminum and silver.

7. The heat dissipation device as claimed in claim 1, wherein the front cover has at least one first air vent, and the rear cover has at least one second air vent.

8. The heat dissipation device as claimed in claim 1, wherein a first venting sheet is mounted between the front cover and the opening of the housing, and a second venting sheet is optionally mounted between the front cover and the opening of the rear cover of the housing.

9. The heat dissipation device as claimed in claim 1, wherein the housing is snapped onto a cap to receive the external contact pad inside the cap.

10. The heat dissipation device as claimed in claim 1, wherein the at least one external contact pad of the substrate is compatible with any one of USB, Mini USB, Micro USB and e-SATA transmission interface.

11. A heat dissipation device of electronic circuit modules, comprising:
    at least one substrate having
        at least one electronic component;
        an inner surface; and
        an outer surface having at least one external contact pad mounted on one end thereof, and at least one transfer contact pad mounted on the other end thereof, and electrically connected with the external contact pad;
    at least one heat dissipation element having a plurality of heat conductors contacted with the at least one transfer contact pad and the at least one external contact pad of another substrate, taking an uneven form, and mounted on a surface of another substrate having the at least one transfer contact pads; and
    at least one housing being hollow, and having two openings formed on two sides thereof, a front cover and rear cover respectively mounted to the two openings, and an airflow passage formed therein;
    wherein the at least one substrate is mounted inside the housing, the at least one external contact pad penetrates through the front cover and is exposed beyond the housing, the rear cover has a through slot, the at least one external contact pad of the at least one substrate inside the housing penetrates through the through slot of the rear cover of another housing to be electrically connected with the at least one external contact pad of the another substrate through the plurality of heat conductors of the heat dissipation element thereof, heat generated when the electronic components of those substrates are operated is conducted to the plurality of heat conductors of the substrates through the external contact pads or the transfer contact pads of the substrates and is guided out of the at least one electronic component by heat convection generated inside the housings by the airflow passages.

12. The heat dissipation device as claimed in claim 11, wherein the at least one external contact pad of one substrate is electrically connected with and reversely and crossly stacked on the at least one transfer contact pad of another substrate through the plurality of heat conductors of the heat dissipation element of the at least one substrate.

13. The heat dissipation device as claimed in claim 11, wherein the at least one external contact pad of one substrate is coplanarly and electrically connected with the at least one transfer contact pad of another substrate through the plurality of heat conductors of the heat dissipation element of the at least one substrate.

14. The heat dissipation device as claimed in claim 11, wherein the at least one electronic component of the substrate comprises at least one IC chip, at least one passive component, and at least one controller, and the IC chip is mounted on the inner surface of the substrate.

15. The heat dissipation device as claimed in claim 11, wherein the passive component and the controller are mounted on the outer surface of the substrate.

16. The heat dissipation device as claimed in claim 11, wherein the airflow passage of the housing takes a form wide outside and narrow inside, and a narrow neck of the airflow passage forms an airflow acceleration zone.

17. The heat dissipation device as claimed in claim 11, wherein a package is formed on the inner surface of the substrate and has an outer periphery, a heat-conducting layer is mounted on the outer periphery and is made arbitrarily at least one material of copper, aluminum and silver.

18. The heat dissipation device as claimed in claim 11, wherein the plurality of heat conductors are made arbitrarily at least one material of copper, aluminum and silver.

19. The heat dissipation device as claimed in claim 11, wherein the housings are tightly connected each other so as to guide the heat generated out of the housings.

20. The heat dissipation device as claimed in claim 11, wherein the front cover has at least one first air vent, and the rear cover has at least one second air vent.

21. The heat dissipation device as claimed in claim 11, wherein a first venting sheet is mounted between the front cover and the opening of the housing, and a second venting sheet is optionally mounted between the front cover and the opening of the rear cover of the housing.

22. The heat dissipation device as claimed in claim 11, wherein a pressing element is mounted inside the housing so as to move up and down inside the housing, the pressing element surrounds the substrate and has a thrust piece, a pressing part and an elastomer, the pressing part and the elastomer are oppositely mounted on two sides of the thrust piece, and the pressing part is partially exposed beyond the housing.

23. The heat dissipation device as claimed in claim 22, wherein the elastomer is one of compression spring, rubber and metal spring leaf.

24. The heat dissipation device as claimed in claim 22, wherein the elastomer and the thrust piece are integrally formed.

25. The heat dissipation device as claimed in claim 11, wherein the housing is snapped onto a cap to receive the external contact pad inside the cap.

26. The heat dissipation device as claimed in claim 11, wherein the at least one external contact pad of the substrate is compatible with any one of USB, Mini USB, Micro USB and e-SATA transmission interface.

27. A heat dissipation device of electronic circuit modules, comprising:
at least one substrate having
at least one electronic component;
an inner surface; and
an outer surface having at least one external contact pad mounted on one end thereof, and at least one transfer contact pad mounted on the other end thereof and electrically connected with the external contact pad; and
at least one heat dissipation element having a plurality of heat conductors contacted with the at least one transfer contact pad and the at least one external contact pad of another substrate, and taking an uneven form, and mounted on a surface of the at least one substrate having the at least one transfer contact pad;
at least one housing being hollow, and having two openings formed on two sides thereof, a front cover and rear cover respectively mounted to the two openings, and an airflow passage formed therein;
an end substrate having at least one electronic component, an inner surface and an outer surface having at least one external contact pad mounted on one end thereof;
an end heat dissipation device electrically connected with the end substrate;
an end housing being hollow, and having two openings formed on two sides thereof, a front cover and a rear cover respectively mounted to the two openings thereof, and an airflow passage formed therein;
wherein the at least one substrate is respectively mounted inside the at least one housing, the at least one external contact pad of the at least one substrate penetrates through the corresponding front cover and is exposed beyond the corresponding housing, the rear cover has a through slot, the end heat dissipation device and the end substrate are mounted inside the end housing, the at least one external contact pad of the end substrate penetrates through the front cover of the end substrate and is exposed beyond the end housing, heat generated when the electronic components are operated is conducted to the plurality of heat conductors through the external contact pads or the transfer contact pads and is guided out of the electronic components by heat convection formed by wind pressure generated by the airflow passages when the end heat dissipation device is operated.

28. The heat dissipation device as claimed in claim 27, wherein the at least one external contact pad of one substrate is electrically connected with and reversely and crossly stacked on the at least one transfer contact pad of another substrate through the plurality of heat conductors of the heat dissipation element of the at least one substrate.

29. The heat dissipation device as claimed in claim 27, wherein the at least one external contact pad of one substrate is coplanarly and electrically connected with the at least one transfer contact pad of another substrate through the plurality of heat conductors of the heat dissipation element of the at least one substrate.

30. The heat dissipation device as claimed in claim 27, wherein the at least one external contact pad of the end substrate is electrically connected with and reversely and crossly stacked on the at least one transfer contact pad of another substrate through the plurality of heat conductors of the heat dissipation element of the at least one substrate.

31. The heat dissipation device as claimed in claim 27, wherein the at least one external contact pad of the end substrate is coplanarly and electrically connected with the at least one transfer contact pad of another substrate through the plurality of heat conductors of the heat dissipation element of the at least one substrate.

32. The heat dissipation device as claimed in claim 27, wherein the at least one electronic component of the substrate comprises at least one IC chip, at least one passive component, and at least one controller, and the IC chip is mounted on the inner surface of the substrate.

33. The heat dissipation device as claimed in claim 27, wherein the passive component and the controller are mounted on the outer surface of the substrate.

34. The heat dissipation device as claimed in claim 27, wherein the at least one electronic component of the end substrate comprises at least one IC chip, at least one passive component, and at least one controller, and the at least one IC chip is mounted on the inner surface of the end substrate.

35. The heat dissipation device as claimed in claim 34, wherein the at least one passive component and the at least one controller are mounted on the outer surface of the end substrate.

36. The heat dissipation device as claimed in claim 27, wherein the airflow passage of the housing takes a form wide outside and narrow inside, and a narrow neck of the airflow passage forms an airflow acceleration zone.

37. The heat dissipation device as claimed in claim 27, wherein a package is formed on the inner surface of the substrate and has an outer periphery, a heat-conducting layer is mounted on the outer periphery and is made arbitrarily at least one material of copper, aluminum and silver.

38. The heat dissipation device as claimed in claim 27, wherein the plurality of heat conductors are made arbitrarily at least one material of copper, aluminum and silver.

39. The heat dissipation device as claimed in claim 27, wherein the housings are tightly connected each other so as to guide the heat generated out of the housings.

40. The heat dissipation device as claimed in claim 27, wherein the front cover has at least one first air vent, and the rear cover has at least one second air vent.

41. The heat dissipation device as claimed in claim 27, wherein the front cover of the end housing has at least one first air vent, and the rear cover has at least one second air vent.

42. The heat dissipation device as claimed in claim 27, wherein a first venting sheet is mounted between the front cover and the opening of the housing, and a second venting sheet is optionally mounted between the front cover and the opening of the rear cover of the housing.

43. The heat dissipation device as claimed in claim 27, wherein a first venting sheet is mounted between the front cover and the opening of the end housing, and a second venting sheet is optionally mounted between the front cover and the opening of the rear cover of the end housing.

44. The heat dissipation device as claimed in claim 27, wherein a pressing element is mounted inside the housing so as to move up and down inside the housing, the pressing element surrounds the substrate and has a thrust piece, a pressing part and an elastomer, the pressing part and the elastomer are oppositely mounted on two sides of the thrust piece, and the pressing part is partially exposed beyond the housing.

45. The heat dissipation device as claimed in claim 44, wherein the elastomer is one of compression spring, rubber and metal spring leaf.

46. The heat dissipation device as claimed in claim 44, wherein the elastomer and the thrust piece are integrally formed.

47. The heat dissipation device as claimed in claim 27, wherein the housing is snapped onto a cap to receive the external contact pad inside the cap.

48. The heat dissipation device as claimed in claim 27, wherein the heat dissipation element is a cooling fan.

49. The heat dissipation device as claimed in claim 27, wherein the heat element is electrically connected with the end substrate through one of bus, wire and metal bump.

50. The heat dissipation device as claimed in claim 27, wherein the at least one external contact pad of the substrate is compatible with any one of USB, Mini USB, Micro USB and e-SATA transmission interface.

* * * * *